United States Patent
Zhang et al.

(10) Patent No.: US 10,600,946 B2
(45) Date of Patent: *Mar. 24, 2020

(54) METHOD OF MANUFACTURING A HEXAGONAL BORON NITRIDE BASED LAMINATE ON LED FILAMENT

(71) Applicant: BGT MATERIALS LIMITED, Manchester (GB)

(72) Inventors: Jingyu Zhang, Huian (CN); Kuo-Hsin Chang, Chiayi (TW); Jia-Cing Chen, Tainan (TW); Chung-Ping Lai, Zhubei (TW)

(73) Assignee: BGT MATERIALS LIMITED, Manchester (GB)

(*) Notice: Subject to any disclaimer, the term of this patent is extended or adjusted under 35 U.S.C. 154(b) by 0 days.

This patent is subject to a terminal disclaimer.

(21) Appl. No.: 16/036,057

(22) Filed: Jul. 16, 2018

(65) Prior Publication Data

US 2020/0020841 A1 Jan. 16, 2020

(51) Int. Cl.
*H01L 33/64* (2010.01)
*F21V 29/70* (2015.01)
*F21V 29/503* (2015.01)
*F21Y 115/10* (2016.01)

(52) U.S. Cl.
CPC .......... *H01L 33/641* (2013.01); *F21V 29/503* (2015.01); *F21V 29/70* (2015.01); *H01L 33/642* (2013.01); *H01L 33/644* (2013.01); *F21Y 2115/10* (2016.08); *H01L 2933/0075* (2013.01)

(58) Field of Classification Search
CPC ... H01L 33/641; H01L 33/642; H01L 33/644; H01L 2933/0075; F21V 29/503; F21V 29/70; F21Y 2115/10
USPC .......................................... 427/106, 111, 289
See application file for complete search history.

(56) References Cited

U.S. PATENT DOCUMENTS

| | | | | |
|---|---|---|---|---|
| 9,933,121 | B2 * | 4/2018 | Lai | ............................ F21K 9/90 |
| 2017/0198187 | A1 * | 7/2017 | Lai | ............................ C09K 5/14 |
| 2017/0227167 | A1 * | 8/2017 | Lai | ............................ F21K 9/135 |
| 2017/0239854 | A1 * | 8/2017 | Zhang | ..................... B29C 41/24 |
| 2017/0284612 | A1 * | 10/2017 | Zhang | .................... C01B 21/064 |
| 2017/0299129 | A1 * | 10/2017 | Lai | ............................ F21K 9/90 |

* cited by examiner

*Primary Examiner* — Brian K Talbot
(74) *Attorney, Agent, or Firm* — Chun-Ming Shih; Lanway IPR Services

(57) ABSTRACT

A method of manufacturing a hexagonal boron nitride (hBN) laminate on a backside of LED filament contains steps of: a) Preparing a substrate of LED filament array; b) Coating the hBN based slurry on the backside of substrate of LED filament and dried at 100-200° C.; c) Cutting the array to single LED filament. A LED filament with hBN based heat dissipation radiation laminate was obtained after this process. For heat dissipation application, hexagonal boron nitride laminate coating can significantly enhance the performance of LED light bulb.

8 Claims, 9 Drawing Sheets

| item | Filament spec | 10.1mA Junction temp /°C | 15.1mA Junction temp /°C | 20.1mA Junction temp /°C |
|---|---|---|---|---|
| 1 | Normal LED metal filament (28 chip) | 90.6 | 134 | 187 |
| 2 | hBN-based laminate coated LED metal filament (28chip) | 87.7 | 126.3 | 171 |
| | Temp. difference (°C) | 2.9 | 7.7 | 16 |

FIG. 6

| | Filament 1 | Filament 2 | Filament 3 |
|---|---|---|---|
| Surface temp. of normal LED metal filament (T1) | 159.0 °C | 132.5 °C | 158.3 °C |
| Surface temp. of hBN-based slurry-coated LED metal filament (T2) | 151.1 °C | 112.8 °C | 133.2 °C |
| Coating thickness of hBN-based layer | ~45 μm | ~140 μm | ~650 μm |
| ΔT (T1−T2) | −7.9 °C | −19.7 °C | −25.1 °C |

FIG. 7

| Time (hrs) | 0 | 150 | 300 | 500 | 1000 | 2000 |
|---|---|---|---|---|---|---|
| lm/w | 109.73 | 109.22 | 106.17 | 103.99 | 99.95 | 91.93 |
| % | 100.0% | 99.5% | 96.8% | 94.8% | 91.1% | 83.8% |

FIG. 9

| Time (hrs) | 0 | 174 | 390 | 504 | 792 | 1180 | 1874 | 2327 |
|---|---|---|---|---|---|---|---|---|
| lm/w | 105.81 | 105.53 | 105.63 | 106.05 | 104.72 | 103.77 | 101.95 | 101.42 |
| % | 100.0% | 99.7% | 99.8% | 100.2% | 99.0% | 98.1% | 96.4% | 95.9% |

FIG. 10

METHOD OF MANUFACTURING A HEXAGONAL BORON NITRIDE BASED LAMINATE ON LED FILAMENT

FIELD OF THE INVENTION

The present invention relates to a method of manufacturing a hexagonal boron nitride based laminate on the back side of LED filament, which significantly enhances the performance of LED filament currently used in LED light bulb.

BACKGROUND OF THE INVENTION

To develop high power LED lighting system makes the highly efficient heat removal and dissipation critical for reliable operation of the LED lighting devices and systems. Hence the industry is in an urgent need of novel thermally conductive materials suitable for various thermal management applications on LED lighting. It is especially beneficial if such materials are electrically insulating since it would make it possible to apply them directly on the electronic circuitry. Unfortunately, most of the economically viable insulating materials are characterized by low thermal conductivity, which seriously limits their application as efficient heat spreaders.

It has been long known that bulk hexagonal boron nitride (hBN) possess one of the highest basal plane thermal conductivities among other materials (up to 400 W/m·K at room temperature) and almost matches that of silver. The more recent interest in hBN has been motivated by the search of an electrically insulating counterpart of graphene suitable for thermal management applications. Apart from excellent dielectric properties, few atomic layer hBN crystals demonstrated high values of thermal conductivity approaching its bulk value, and ultimately predicted to exceed those. Considering the rare combination of the electrical insulating behaviour with exceptionally high thermal conductivity hexagonal boron nitride is a promising candidate for the next-generation thermal management materials. However to exploit the remarkable properties of the few-layer hBN crystals for practical applications would require thermally conductive layers to be either flexible or conformal with the surface, and to have little heat junction within channel in a preferred orientation. All of those requirements can be satisfied by obtaining laminates consistent of thin (preferable monolayer) hBN crystals. It has been demonstrated before that graphene laminates possess relatively high thermal conductivity (up to 100 W/m·K) alongside with perfect coating properties. Unfortunately, the number of potential thermal management applications of such graphene laminates is limited by their high electrical conductivity. On the other hand, hBN laminates are also expected to provide high thermal conductivity in conjunction with excellent electrical insulating properties, which can potentially become a paradigm changer for the electronic industry.

The present invention has arisen to mitigate and/or obviate the afore-described disadvantages.

SUMMARY OF THE INVENTION

The primary objective of the present invention is to provide a method of manufacturing a hexagonal boron nitride based laminate on the backside of LED filament which enhanced the performance of LED filament due to the high heat dissipation rate after coating the hexagonal boron nitride based laminate.

To obtain above-mentioned objective, a method of manufacturing hexagonal boron nitride based laminate on the backside of LED filament provided by the present invention contains steps (see FIG. 1) of:
 a) Preparing a substrate of LED filament array.
 b) Coating the hBN based slurry on the backside of substrate of LED filament and dried at 100-200° C. to form hBN based heat dissipation radiation laminate.
 c) Cut the array to single LED filament. A LED filament with hBN based heat dissipation radiation laminate was obtained after this process.

By the above manufacturing method, the substrate of LED filament is selected from the group of metals, ceramics, glass, and plastics.

Beside the hBN powders, the hBN based slurry can also consist of other heat dissipation filler, such as carbon materials, metal particles or ceramic powders.

The method for coating the hBN based slurry on the backside of substrate of LED filament can be glue dispensing, stencil printing, screen printing, relief printing, lithography printing, gravure printing, ink spray, and ink brushing.

Moreover, the LED filament can be further bended to curve shape for various appearances of LED light bulb.

BRIEF DESCRIPTION OF THE DRAWINGS

FIG. 2 (B) is a cross-sectional SEM image of hBN laminate, wherein scale bar is 10 µm according to the preferred embodiment of the present invention.

FIG. 6 is a list illustrating a test of junction temperature of a chip on an LED filament with/without hBN based laminate coating according to the preferred embodiment of the present invention.

FIG. 7 is a list illustrating a test result of the surface temperature of LED filament with/without hBN based laminate-coating on various coating thicknesses according to the preferred embodiment of the present invention.

FIG. 9 is a list showing aging test data of the non-coated LED metal filament fixed on the light bulb of 8 W according to the preferred embodiment of the present invention.

FIG. 10 is a list aging test data of the hBN based laminate-coated LED metal filament fixed on the light bulb of 8 W according to the preferred embodiment of the present invention.

DETAILED DESCRIPTION OF THE PREFERRED EMBODIMENTS

Figure 1:
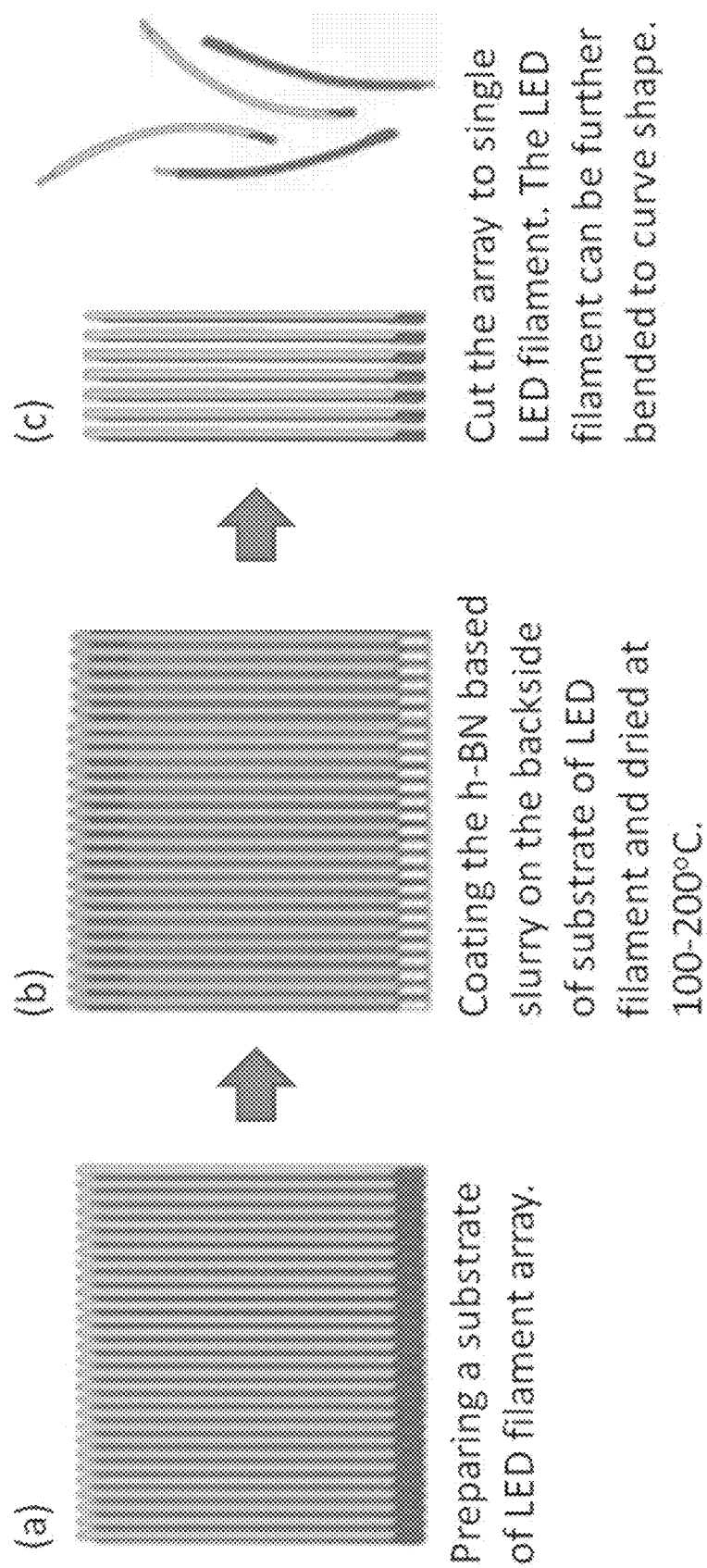
FIG. 1 is a schematic view showing steps of a method of manufacturing hexagonal boron nitride based laminate on the backside of LED filament according to a preferred embodiment of the present invention.

As FIG. 1, a method of manufacturing a hexagonal boron nitride based laminate on the backside of LED filament according to a preferred embodiment of the present invention contains steps of:

a) Preparing a substrate of LED filament array;
b) Coating the hBN based slurry on the backside of substrate of LED filament and dried at 100-200° C. to form hBN based heat dissipation radiation laminate; and
c) Cutting the array to single LED filament, wherein an LED filament with hBN based heat dissipation radiation laminate was obtained after this process.

By the above manufacturing method, the substrate of LED filament is selected from the group of metals, ceramics, glass, and plastics.

Beside the hBN powders, the hBN based slurry can also consist of other heat dissipation radiation filler, such as carbon materials, metal particles or ceramic powders.

The method for coating the hBN based slurry on the backside of substrate of LED filament can be glue dispensing, stencil printing, screen printing, relief printing, lithography printing, gravure printing, ink spray, and ink brushing.

Moreover, the LED filament can be further bended to curve shape for various appearances of LED light bulb.

Figure 2:
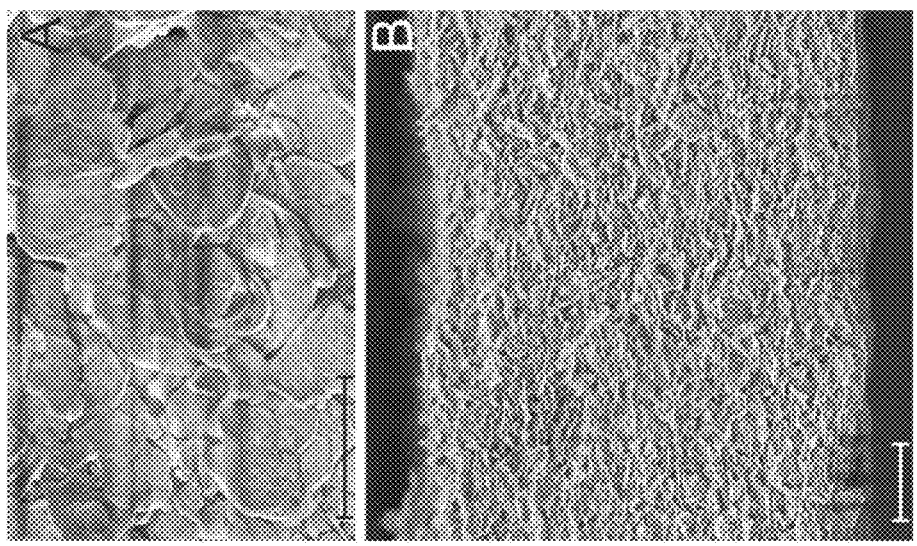
FIG. 2 (A) is a SEM micrograph of the surface of the hBN laminate, wherein vertical variations of contrast are due to the charging, and scale bar is 1 µm according to the preferred embodiment of the present invention.

For the analyses of thermal conductivity and heat dissipation of such hBN laminate film are shown as the following. In FIG. 2, analysis of the top and cross-sectional SEM images of the laminate film reveal the dominant lateral dimensions of hBN laminate film are around 1 μm with average thickness of about 10 nm. The SEM figures also reveal how hBN powders construct heat dissipation channels to exhibit its high thermal conductivity. FIG. 2A shows the lateral contacts between hBN powders, while FIG. 2B illustrates an amorphous stacking of hBN powders in cross sectional view, which ensures the heat could be dissipated to all directions.

The thermal conductivity κ of the investigated laminate has been calculated using equation $$\kappa = \alpha \rho C_p, \quad (1)$$

here α is the in-plane thermal diffusivity, ρ is the material density and $C_p$ is the specific heat. All three parameters were independently determined in experiment.

The thermal diffusivity α as a function of temperature T has been measured by the laser flash method using commercially available system (Netzsch LFA 457). To measure the in-plane thermal diffusivity the special sample holder has been used, which accommodates the free-standing hBN membrane samples cut into a round shape of 22 mm in diameter. A small spot of about 5 mm in diameter at the back side of the sample is flash heated by the laser beam. The heat diffusion as a function of time is registered by the infrared detector along the top circumference of the membrane at 5 mm to 6 mm from the centre of the sample. To avoid undesirable reflections the sample and sample holder have been spray coated with graphite paint. During the measurements the sample chamber of the laser flash system was continuously purged with nitrogen gas at the rate of 30 ml/min. The sample specific heat $C_p$ was measured by the differential scanning calorimeter (Netzsch DSC 404 F3) using sapphire as a reference sample. The mass density ρ was estimated by weighting the sample of the known dimensions with precision electronic balances.

Figure 3:
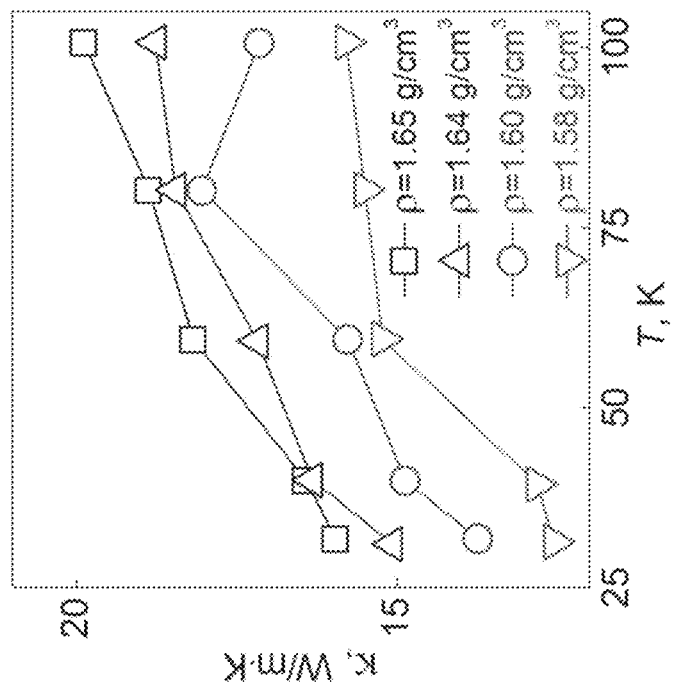
FIG. 3 is a diagram showing thermal conductivity κ as a function of temperature T measured for different values of hBN laminates density ρ according to the preferred embodiment of the present invention.

To evaluate the effect of the membrane composition we measured the thermal conductivity κ as a function of temperature T for four hBN laminates with different mass density. As seen from FIG. 3, the thermal conductivity is weakly dependent on temperature and increases with the increasing density. The observed values of the thermal conductivity fall in the range between 10 W/m·K to 20 W/m·K, which is certainly an industrially relevant value.

To better understand the influence of the material density on the thermal conductivity we studied the dependence of κ on ρ at room temperature. The density of the laminate samples was controlled in two different ways: (i) by using hBN flakes of different thickness (only limited variations of ρ could be achieved in this way), and (ii) by variation of the additional roller compression applied during preparation of the laminates. Both methods had the same effect on the thermal conductivity. The combined results of this study are presented in FIG. 4. Similarly to the data shown in FIG. 3 the thermal conductivity tends to increase with the increasing density of the hBN laminate.

After systematic SEM examination of the laminates of different density, we concluded that the density variations are mostly due to the variation in the size of empty voids present between stacked hBN flakes. The schematic representation of two laminates with different density is given in FIG. 5. Thus we attribute the decreasing thermal conductivity to the discontinuity in the thermal path brought by the larger number of voids.

Figure 5:
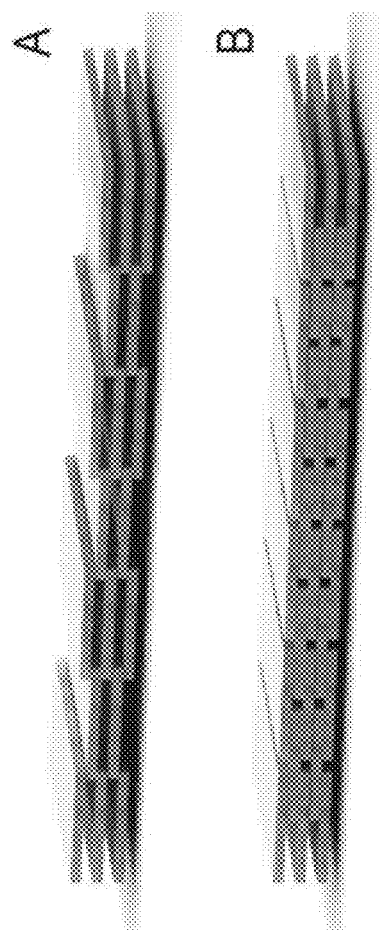
FIG. 5 is a schematic view illustrating the laminate model used in numerical simulations for low (A) and high (B) density samples, wherein an individual hBN flake is modeled by a solid block with lateral dimensions 1 µm×1 µm and thickness 10 nm according to the preferred embodiment of the present invention.

To confirm our suggestions, we carried out modeling of the thermal flow in laminates with voids. Our numerical simulation was done using ABAQUS 2011 finite element analysis software package. In order to explore the relation between the effective thermal conductivity and the density of hBN laminates we simulated the steady-state heat transfer governed by equation $$\rho C_p \frac{\partial T}{\partial t} = \frac{\partial}{\partial x}\left(\kappa(T)\frac{\partial T}{\partial x}\right) + \frac{\partial}{\partial y}\left(\kappa(T)\frac{\partial T}{\partial y}\right) + \frac{\partial}{\partial z}\left(\kappa(T)\frac{\partial T}{\partial z}\right) + Q, \quad (2)$$

where Q is the heat flux and ∂T/∂t=0 (steady-state heat transfer). The modeled system was evaluated with the ABAQUS element type DC2D8 and represented by a strip of orderly stacked solid blocks of thermally conductive media with lateral size of 1 μm×1 μm and thickness of 10 nm, as show in FIG. 5. To mimic the hBN flakes the thermal conductivity of the solid blocks was chosen to be 390 W/m·K at room temperature. To vary the effective density of the modeled laminates, we adjusted the overlap area of the adjacent blocks as illustrated in FIGS. 5 (A) and 5 (B). Also, to account for the imperfect thermal contact between the stacked flakes the finite thermal contact conductance has been introduced to the model. The final modeling results were matched to the experimental data by variation of the thermal contact conductance in the range of $10^5$ W/m²K to 10⁶ W/m²K. The resulting effective thermal conductivity $\kappa_{\textit{eff}}$ of the hBN laminate was calculated using the Fourier law $$\kappa_{\textit{eff}} = q\frac{L}{\Delta T}. \qquad (3)$$

Here q is the total net heat flux through the cross section of the laminate, L is the total length of the laminate strip and ΔT is the temperature difference between hot and cold ends of the strip.

Figure 4:
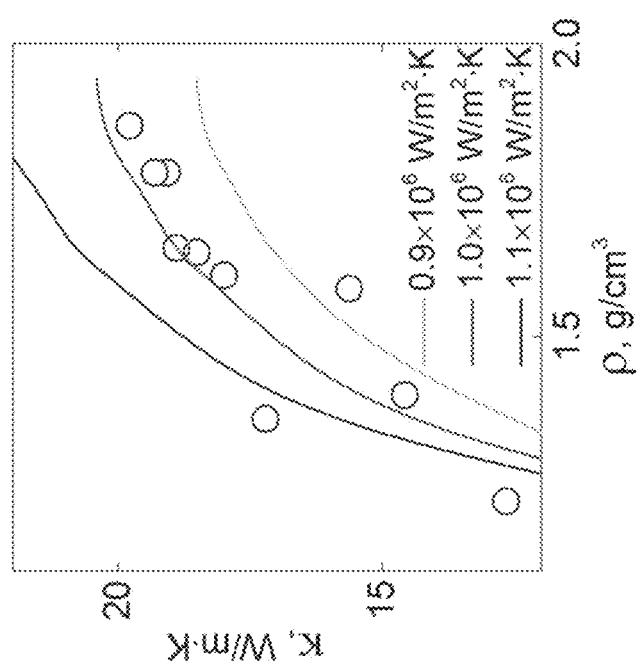
FIG. 4 is a diagram showing thermal conductivity κ of hBN laminates as a function of density measured at 80° C. (blue circles), wherein solid curves represent results of numerical simulations at different values of the thermal contact conductance according to the preferred embodiment of the present invention.

The result of the numerical simulation is shown by solid curves in FIG. 4. Each of the curves represents the effective thermal conductivity of the laminate with different thermal contact resistance between the stacked hBN flakes. The simulation shows only qualitative agreement with the experimental data because of simplicity of our model. A more accurate simulation would have to take into account size distribution of the flakes as well as the dependence of the contact conductance on the packing density. Nevertheless, our initial assumption that the thermal conductivity is restricted by the presence of the empty voids inside the laminate has been confirmed by this simple model. Also, it gave us a rough estimate of the thermal contact conductance to be of the order of 10⁶ W/m²·K. There is no data on the thermal contact conductance is available for such a system, however experimental study of a rather similar graphene/hBN interface reveals the value of around 7.10⁶ W/m²·K, which is almost an order of magnitude higher than estimated in our simulation. The most probable explanation to this is the fact that the hBN flake surfaces are contaminated with solvent residues, which in turn reduces thermal conductivity across the flake-to-flake interface.

In conclusion, we demonstrated that hBN inks can be used to produce laminates with thermal conductivity as high as 20 W/m·K in the above mentioned embodiment, which is significantly larger than that for materials currently used in thermal management. We also show that the effective thermal conductivity can be adjusted by varying the laminate packing density. We also identify a potential way for further increase in of thermal conductance by improving the quality of the flake-to-flake interface. Being electrically insulating, hBN based laminates can potentially open a new avenue for using the advanced thermal management materials.

As shown in FIGS. 6-10, further comparisons of heat dissipation ability and light bulb performance between LED metal filaments with and without coating hBN based laminate were carried out in order to exhibit our invention of hBN based materials on LED heat radiation dissipation application, thus obtaining a heat dissipation result of the LED light bulb assembled by the LED filament with and without hBN based laminate. In FIG. 6, after the hBN based laminate is coated on an LED metal filament of the LED light bulb, a junction temperature of a chip of the LED light bulb is lower that of non-coated LED light bulb. In high current condition, a difference of the junction temperature of the chip of the LED light bulb increases, hence the hBN based laminate reduces the temperature of the chip of the LED light bulb and will enhances luminous efficiency of the chip of the LED light bulb. Not only the junction temperature of LED chip but also the surface temperature of LED filament will significantly reduce by coating hBN based laminate, especially under the thick coating (see FIG. 7).

Figure 8:
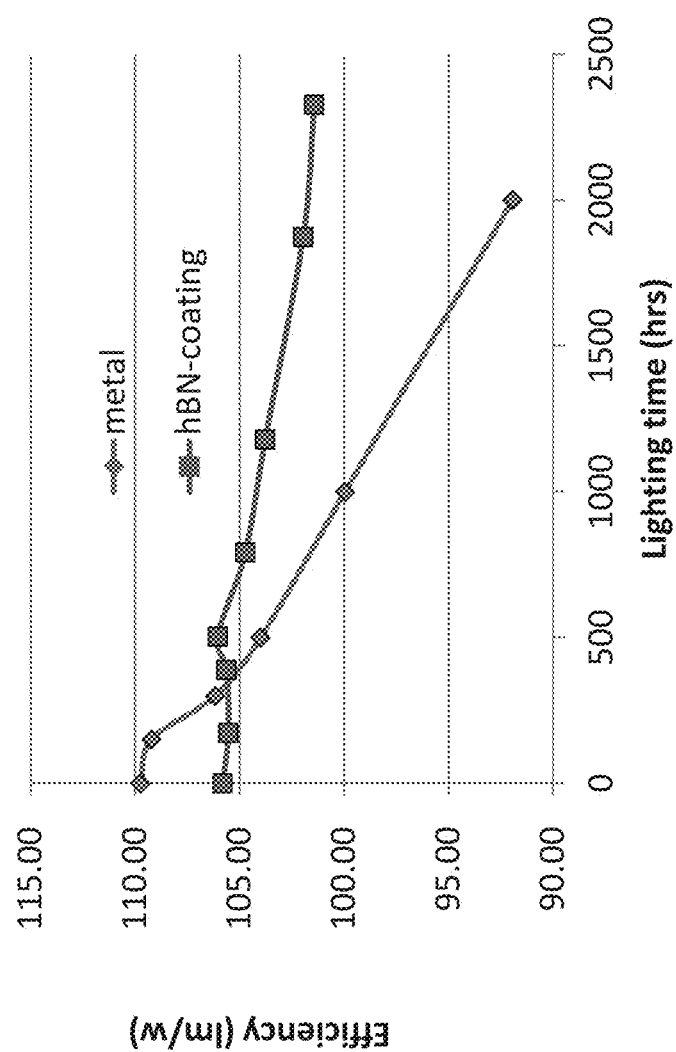
FIG. 8 is a diagram view illustrating luminous efficiency of the LED light bulb assembled by the LED filament with/without hBN based laminate-coating according to the preferred embodiment of the present invention.

As illustrated in FIGS. 8-10, the filament temperature of the LED light bulb is reduced so as to lighting time of LED light bulb. According to the Energy Star test standards, compared with the non-coated LED bulbs, the LED light bulb on which the hBN based laminate is coated, the light time of the LED light bulb is up to 20,000 hours, but the lighting time of the non-coated LED bulbs on which the hBN based material is not coated, is 15,000 hours.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of manufacturing a hexagonal boron nitride (hBN) based laminate on a backside of LED filament consisting steps of:
    a) Preparing a substrate of an LED filament array;
    b) Coating hBN based slurry on a backside of the substrate of the LED filament array and drying the hBN based slurry at 100° C.-200° C. to form hBN based heat dissipation radiation laminate; and
    c) Cutting the LED filament array to a LED filament so as to produce the LED filament with the hBN based heat dissipation radiation laminate.

2. The method as claimed in claim 1, wherein the substrate of the LED filament is selected from a group of metals, ceramics, glass, and plastics.

3. The method as claimed in claim 1, wherein the hBN based slurry also consists of any one of heat dissipation radiation filler of carbon materials, metal particles, and ceramic powders.

4. The method as claimed in claim 1, wherein a coating of the hBN based slurry is any one of glue dispensing, stencil printing, screen printing, relief printing, lithography printing, gravure printing, ink spray, nozzle printing, and ink brushing.

5. The method as claimed in claim 2, wherein the substrate is selected from the group of metals, ceramics, glass, and plastics, which are flexible, so the LED filament is further bended to a curve shape for various appearances of LED light bulb.

6. The method as claimed in claim 3, wherein the carbon materials includes at least one of graphene, carbon black, graphite, carbon nanotubes, and activated carbon.

7. The method as claimed in claim 3, wherein the metal particles includes at least one of Cu, Ni, Zn, Fe, Co, Ag, Au, Pt and their alloys.

8. The method as claimed in claim 3, wherein the ceramic powders includes at least one of $SiO_2$, Al2O3, TiO2, ZrO2, ZrC, SiC, TaC, TiB2, ZrB2, TiSi2, Si3N4, TiN, BN, and phosphors.

\* \* \* \* \*